US010861571B1

(12) United States Patent
Yang et al.

(10) Patent No.: US 10,861,571 B1
(45) Date of Patent: Dec. 8, 2020

(54) WORDLINE VOLTAGE OVERDRIVE METHODS AND SYSTEMS

(71) Applicant: SanDisk Technologies LLC, Addison, TX (US)

(72) Inventors: Xiang Yang, San Jose, CA (US); Yu-chung Lien, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/432,000

(22) Filed: Jun. 5, 2019

(51) Int. Cl.
| G11C 16/04 | (2006.01) |
| G11C 16/34 | (2006.01) |
| G11C 16/08 | (2006.01) |
| G11C 16/24 | (2006.01) |
| G11C 16/26 | (2006.01) |
| G11C 11/56 | (2006.01) |

(52) U.S. Cl.
CPC ...... *G11C 16/3445* (2013.01); *G11C 16/0483* (2013.01); *G11C 16/08* (2013.01); *G11C 16/24* (2013.01); *G11C 16/26* (2013.01); *G11C 11/5621* (2013.01); *G11C 11/5671* (2013.01)

(58) Field of Classification Search
CPC . G11C 16/3445; G11C 16/0483; G11C 16/08; G11C 16/24; G11C 16/26; G11C 11/5621; G11C 11/5671
USPC ............ 365/185.01, 185.02, 185.03, 185.05, 365/185.06, 185.1, 185.11, 1, 185.17, 365/185.21, 185.22
See application file for complete search history.

(56) References Cited

U.S. PATENT DOCUMENTS

| 7,872,921 | B2 * | 1/2011 | Kim ......................... G11C 8/08 |
| | | | 365/185.29 |
| 8,379,454 | B2 * | 2/2013 | Kochar .................. G11C 29/52 |
| | | | 365/185.19 |
| 8,902,667 | B2 * | 12/2014 | Mu ....................... G11C 29/021 |
| | | | 365/185.22 |
| 9,142,315 | B2 * | 9/2015 | Mu .................... G11C 16/3418 |
| 9,343,172 | B2 * | 5/2016 | Mu ......................... G11C 16/14 |
| 2009/0231928 | A1 * | 9/2009 | Kim ......................... G11C 8/08 |
| | | | 365/185.22 |
| 2012/0281479 | A1 * | 11/2012 | Kochar ................ G11C 29/025 |
| | | | 365/185.19 |
| 2012/0327719 | A1 | 12/2012 | Lue |
| 2013/0051152 | A1 | 2/2013 | Lee et al. |
| 2014/0029350 | A1 * | 1/2014 | Mu .................... G11C 16/3418 |
| | | | 365/185.22 |

(Continued)

OTHER PUBLICATIONS

International Search Report and Written Opinion, PCT/US2019/066823, dated Jul. 28, 2020, 10 pages.

*Primary Examiner* — Harry W Byrne
(74) *Attorney, Agent, or Firm* — Dickinson Wright PLLC; Steven Hurles

(57) ABSTRACT

A methodology and structure for performing an erase verify in non-volatile memory is described. Both the odd wordlines and the even wordlines are driven to a high voltage level. This can be done simultaneously. The simultaneous charging of both the odd wordlines and the even wordlines, even when the erase verify will occur on only one of the odd or even wordlines reduces RC delay in the charging of the wordlines. After the odd and even wordlines are charged, then one set of wordlines, either the odd or even wordlines, is dropped to the erase verify voltage. The erase sense operation is then performed.

13 Claims, 13 Drawing Sheets

(56) References Cited

U.S. PATENT DOCUMENTS

| | | | |
|---|---|---|---|
| 2015/0049555 A1* | 2/2015 | Mu | G11C 16/3459 365/185.22 |
| 2017/0200506 A1 | 7/2017 | Shim | |
| 2017/0221556 A1 | 8/2017 | Louie et al. | |
| 2019/0096488 A1 | 3/2019 | Joe et al. | |

* cited by examiner

WORDLINE VOLTAGE OVERDRIVE
METHODS AND SYSTEMS

TECHNICAL FIELD

This disclosure relates to memory systems, and in particular, to memory methods and systems with an overdrive of both odd an even wordlines for erase verify.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, such as a source select line and a drain select line.

Memory device, like most semiconductor devices, continue to shrink in size to pack more circuits per chip. In memory devices they may be many of the same conductive paths adjacent one another, which are constantly being moved closer together. This results in a greater signal delay along one of the conductive paths due to capacitance between the conductive paths, i.e., $C=(c*A)/d$, where C is capacitance is farads, c is permittivity of the dielectric, A is the area of the plate overlap, and d is the distance between the plates. As the capacitive effects increase, the RC delay may also increase.

SUMMARY

This disclosure relates generally to memory systems and methods that drive both odd and even wordlines to a same first signal level to reduce RC delay. The group of wordlines not needed to be at the signal level is then reduced to a second signal level. One group of wordlines is overdriven and then ramped down to the second signal level while the other group of wordlines remains at the first signal level. The first signal level can be an erase verify level. Example embodiments may result in a reduced time to achieve the first signal level and may provide a shorter time to the erase verify operation even when the non-verify group is ramped down to the second signal level.

An aspect of the disclosed embodiments includes an erase method for non-volatile memory that includes driving both a plurality of odd wordlines and a plurality of even wordlines to a read voltage; ramping a non-verify one of the plurality of odd wordlines and the plurality of even wordlines to a target voltage that is less than the read voltage; holding a verify one of the plurality of odd wordlines and the plurality of even wordlines at the read voltage; and performing an erase verify on the verify one of the plurality of odd wordlines and the plurality of even wordlines.

An aspect of the disclosed embodiments includes driving both the plurality of odd wordlines and the plurality of even wordlines to the read voltage operates to reduce capacitive delays in electrical signal propagation along both the plurality of odd wordlines and the plurality of even wordlines with adjacent wordlines being driven to a same voltage at a same time.

An aspect of the disclosed embodiments includes driving the read voltage from a near, first end to a far, second end of the wordlines over a drive time period.

An aspect of the disclosed embodiments includes ramping after the drive time period.

An aspect of the disclosed embodiments includes reducing voltage at the second end to an order of magnitude less than the read voltage.

An aspect of the disclosed embodiments includes performing the sensing after the target voltage is reached at the second end of the wordlines.

An aspect of the disclosed embodiments includes continuing ramping until the target voltage is reached at the second end of the wordlines.

An aspect of the disclosed embodiments includes performing the sensing after the target voltage is reached at the second end.

An aspect of the disclosed embodiments includes synchronizing the driving of a signal on the plurality of odd wordlines and the plurality of even wordlines to the read voltage.

An aspect of the disclosed embodiments includes driving the wordline signal to the read voltage of greater than five volts.

An aspect of the disclosed embodiments includes ramping from the read voltage to a target voltage of less than one volt.

An aspect of the disclosed embodiments includes driving both the plurality of odd wordlines and the plurality of even wordlines to the read voltage to minimize wordline coupling between adjacent odd and even wordlines.

An aspect of the disclosed embodiments includes structures for non-volatile memory to perform any of the above method steps.

An aspect of the disclosed embodiments includes non-volatile memory, comprising: a plurality of even wordlines; a plurality of odd wordlines alternating with ones of the plurality of even wordline; a plurality of memory cells in a vertical stack connected to the plurality of even wordlines and the plurality of odd wordlines; controller circuitry to issue control signals. The control signal can include signals to: drive both a plurality of odd wordlines and a plurality of even wordlines to a read voltage; ramp a verify one of the plurality of odd wordlines and the plurality of even wordlines to a target voltage that is less than the read voltage;

hold a non-verify one of the plurality of odd wordlines and the plurality of even wordlines at the read voltage; and perform an erase verify on the verify one of the plurality of odd wordlines and the plurality of even wordlines.

An aspect of the disclosed embodiments includes the controller circuitry being configured to reduce capacitive delays in electrical signal propagation along both the plurality of odd wordlines and the plurality of even wordlines with adjacent wordlines being driven to a same voltage at a same time.

An aspect of the disclosed embodiments includes the controller circuitry being configured to drive the read voltage from a near, first end to a far, second end of the wordlines over a drive time period.

An aspect of the disclosed embodiments includes the controller circuitry being configured to ramp after the drive time period.

An aspect of the disclosed embodiments includes the controller circuitry being configured to reduce voltage at the second end to an order of magnitude less than the read voltage.

An aspect of the disclosed embodiments includes the controller circuitry performing the sensing after the target voltage is reached at the second end.

An aspect of the disclosed embodiments includes the controller circuitry continuing ramping until the target voltage is reached at the second end.

An aspect of the disclosed embodiments includes the controller circuitry being configured to perform the sensing after the target voltage is reached at the second end.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
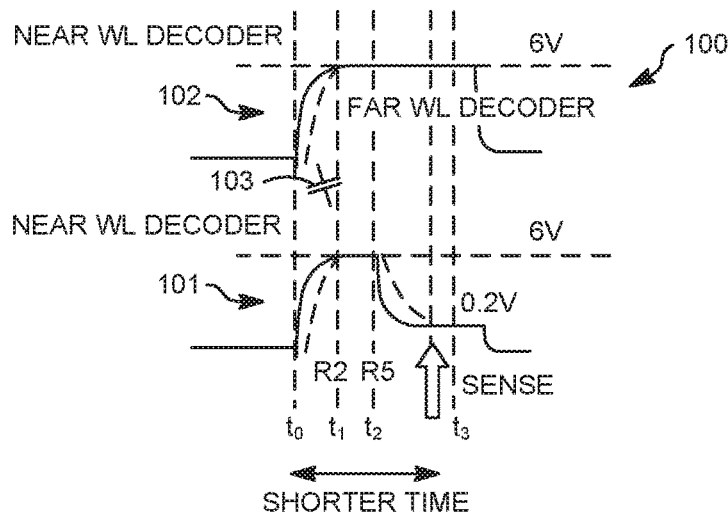
FIG. 1A shows a schematic view of wordline erase verify for a nonvolatile memory according to an aspect of the present disclosure.

FIG. 1 generally illustrates a schematic view of wordline timing 100 for a non-volatile memory, e.g., a NAND memory device. The wordline timing schematic shows the odd wordline signal 101 and an even wordline signal 102. The signals 101, 102 are charging a wordline for an operation using the wordlines, e.g., an erase verify operation. The wordline timing 100 shows two wordlines, an odd word line and an even wordline for ease of illustration. In operation, a plurality of odd wordlines and a plurality of even wordlines would be used at the same time. The signals 101, 102 charge the odd wordlines and the even wordlines from a zero state to an erase verify state, here shown as zero volts and six volts, respectively. The wordlines are significantly longer than there are wide and are closely spaced from the adjacent wordlines, 70 nm or less, 45 nm or less. Moreover, the wordlines are made so that they are perfectly stacked one above another. This results in capacitive effects adding to the RC delay in the electrical signal traveling the length of the wordline. The capacitive effect is more pronounced when one wordline is charged and the adjacent two wordlines are not charged. The capacitive effect between the odd wordline 101 and the even wordline 102 is schematically shown at 103. The present disclosure describes charging both the odd wordline 101 and the even wordline 102 at the same time for the erase verify operation. Thus, when the odd wordlines are undergoing an erase verify operation then they and the even wordlines 102 are both charged to the erase verify voltage level. When the even wordlines 102 are undergoing an erase verify operation then they and the odd wordline 101 are both charged to the erase verify voltage level. The signal at the near end wordline decoder for each wordline is shown in solid line. The signal at the far end wordline decoder for each wordline is shown in broken line. In operation, at time t0, both the odd wordline and the even wordline are charged. It takes some delay for the signal to propagate down the wordlines. At time $t_1$, both the odd wordline 101 and the even wordline 102 are at the erase verify charge voltage level. The process waits a time period between $t_1$ and $t_2$. This will ensure that all of the plurality of wordlines being charged reach the erase voltage charge level. At time $t_2$, the wordlines not being used for the erase verify, i.e., one of the plurality of odd wordlines or the plurality of even wordlines, is held at the erase verify charge level. Here, the even wordline 102 is not being used to verify the erase of the even memory cells. The odd wordline 101 is being used to verify the erase of the memory cells associated with odd wordlines. The signal on the plurality of odd wordlines 101 is reduced to less than one volt, e.g., 0.5 volts, 0.2 volts or less, i.e., to the verify level. When the verify wordlines 101 reach this reduced voltage level, then the erase verify sense operation on the verify wordline (here the odd wordlines) is performed at time $t_3$. In an example embodiment, the far end of the non-verify wordline reaches the reduced signal level at or before time $t_3$, i.e., the time that the verify wordline group of memory cell is subject to a sense operation to verify the erase thereon.

As the present methodology, charges both the odd and even wordlines, the RC delay between adjacent wordlines is reduced due to a reduction in the difference in the capacitance between the plates being the same. Charging adjacent odd and even wordlines at the same time is believed to reduce the capacitive effect between the adjacent wordlines. Thus, the time for the wordlines to reach the state, i.e., reach time $t_3$ in FIG. 1, is reduced. The sense operation can begin early than the conventional process which charges only the one group of wordlines that is being subject to the sense operation in the erase verify.

An erase verify is performed to verify that all nonvolatile memory cells in a NAND string are properly erased without overerasing. Typically, a bias voltage is applied to the source of the bottom select gate of the NAND memory cell array and a non-negative erase verify voltage is applied to the control gates of each memory cell during an erase verify. The wordlines can be connected to the control gates of the memory cells. The bias voltage is at least equal to the erased threshold voltage of the worst case memory cell to ensure proper erase verification. If not all memory cells are erased, then another erase operation is performed. Erasing is repeated until the erase verify operation indicates that all memory cells are properly erased. By erasing and verifying according to the present disclosure, the NAND array is completely and properly erased while minimizing overerasing the array.

Figure 1B:
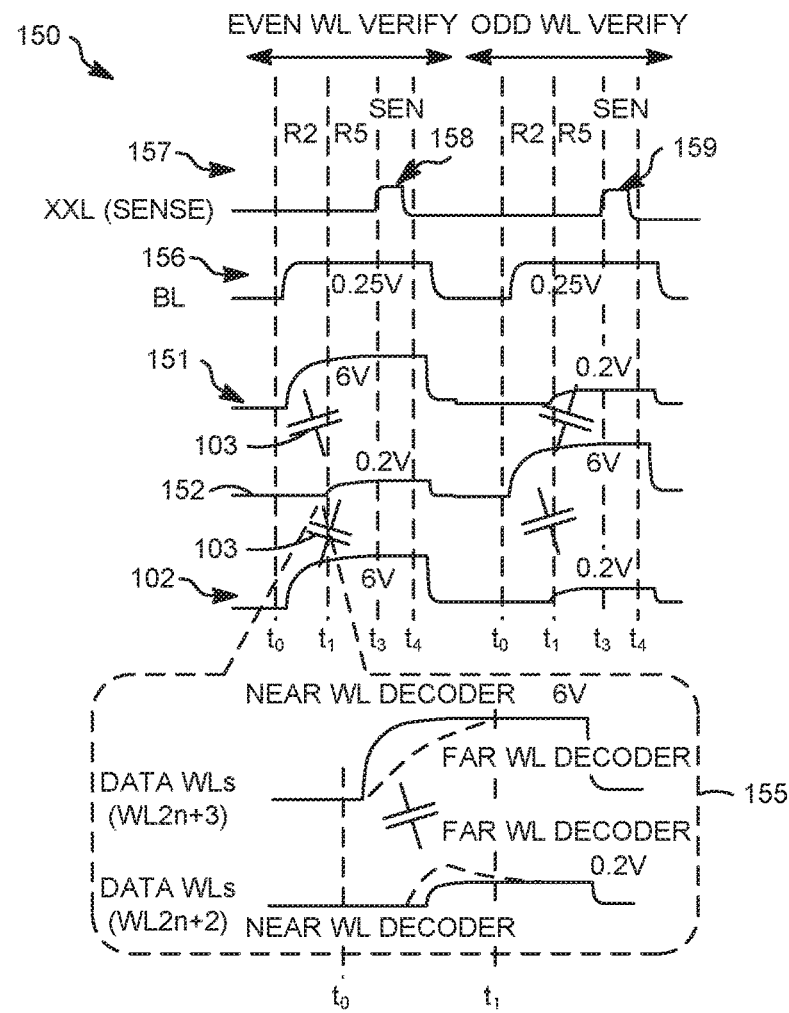
FIG. 1B shows a schematic view of wordline erase verify for a nonvolatile memory according to an aspect of the present disclosure.

FIG. 1B generally illustrates schematic view of conventional wordline timing 150 for a non-volatile memory, e.g., a NAND memory device. Here only one of the odd or even plurality of wordlines 151 or 152 is charged to the erase verify charge voltage level. The other of the of the odd or even plurality of wordlines 151 or 152 is charged to the verify level, which is less than the charge voltage level. As these wordlines 151, 152 are charged at different levels, they experience greater RC delay due to the parasitic capacitance 103 between the adjacent wordlines. In the illustrated example, it takes longer for the odd wordlines 151 to reach the verify charge level at both the near end and the far end in an even wordline verify. The even wordline 152 also is incorrectly overcharged at the far end by the capacitive effect with the adjacent odd wordlines. These effects are better illustrated in the expanded call out 155. The bit line 157 for the group of memory cells is also charged for the verify operation. The sense circuitry operates at time $t_3$ to verify the erase for the even wordline at 158. The sense circuitry operates at time $t_3$ to verify the erase for the even wordline at 159.

The near end and far end of the wordlines are defined by the connection to a signal source to apply a signal to the wordline. The near end of the wordline is closer to the charge connection than the far end of the wordline. A sense device may be connected to just the near end of the wordline. A sense device may be connected to both the near end and the far end of the wordline.

Figure 2:
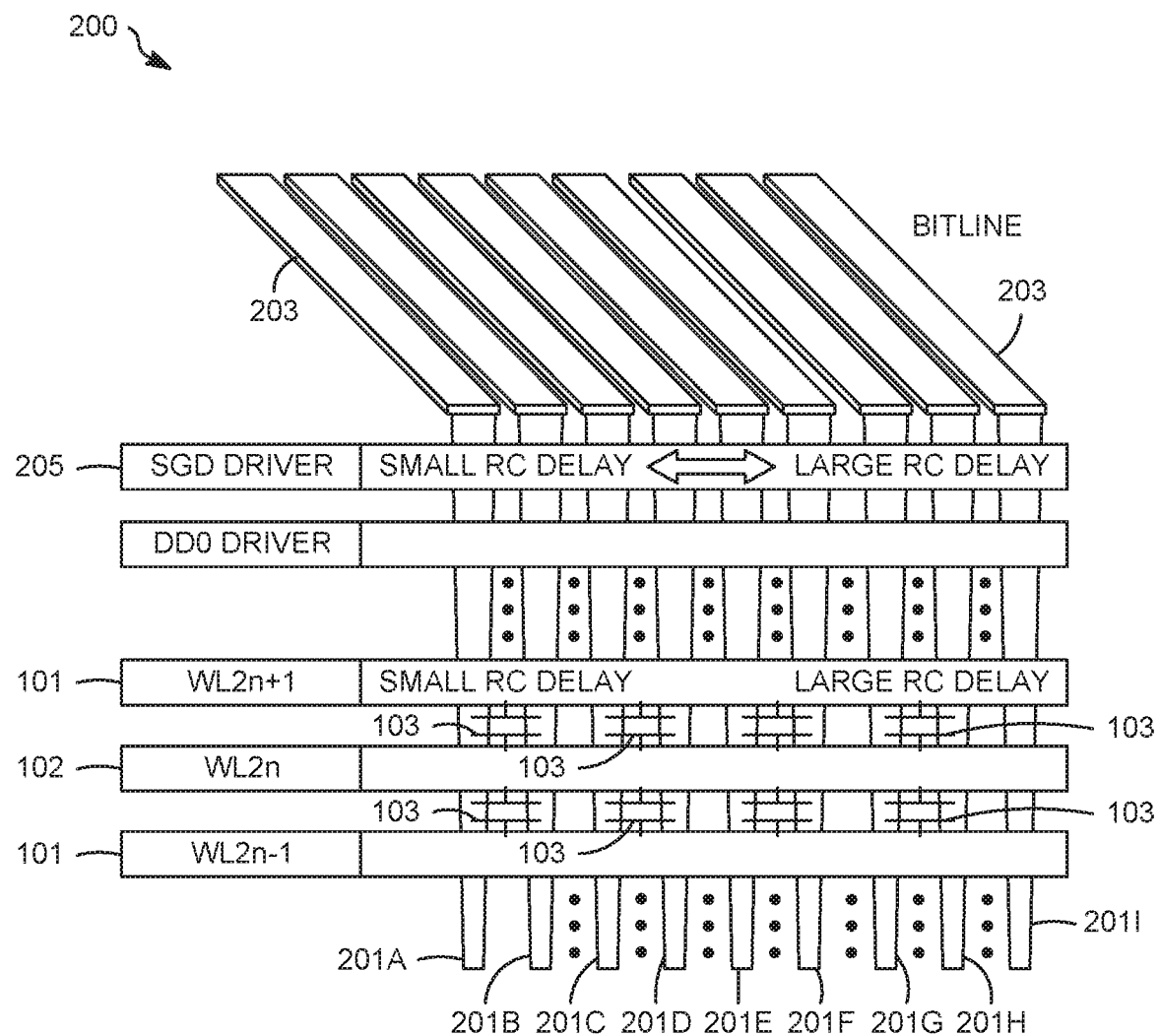
FIG. 2 shows a schematic view of a nonvolatile memory according to an aspect of the present disclosure.

FIG. 2 illustrates a vertical memory structure 200, which can implement the erase verify 100 as described herein. The memory structure 200 shows a plurality of vertically oriented memory strings 201A-201I that are spaced from left to right. A bitline 203 connects to the top of the memory strings 201A-201I, respectively. A NAND string typically includes select gate (SG) transistors at each end. For example, a drain-side select gate (SGD) transistor is at a drain end of the NAND string and a source-side select gate (SGS) transistor is at an opposite source end of the NAND string. The SGD driver circuitry 205 connects to the each of SGD transistors at the top of the memory strings to control the operation of the SGD transistors. The DDO driver also connects to each string and provides a data path to each string. A plurality of odd and even wordlines 101, 102, connect to each vertical memory string, e.g., one wordline for each memory cell in the vertical string. Each of the horizontally extending components, i.e., SGD driver line, DDO line, and wordlines 101, 102 experience a small RC delay at the near end, where they are connected to the respective line and a larger RC delay to the far end of the line. The line can be a conductive layer in the solid state device. Moreover, each adjacent layer can experience capacitive effects, here shown as capacitors 210 as the line have a significant length, directly overlie each other and are placed closer and closer together with successive generations of fabrication improvements. Thus, the capacitive effect on the RC delay increases. The present disclosure describes using a novel charging method and system to reduce the capacitive effect on the RC delay.

Figure 3:
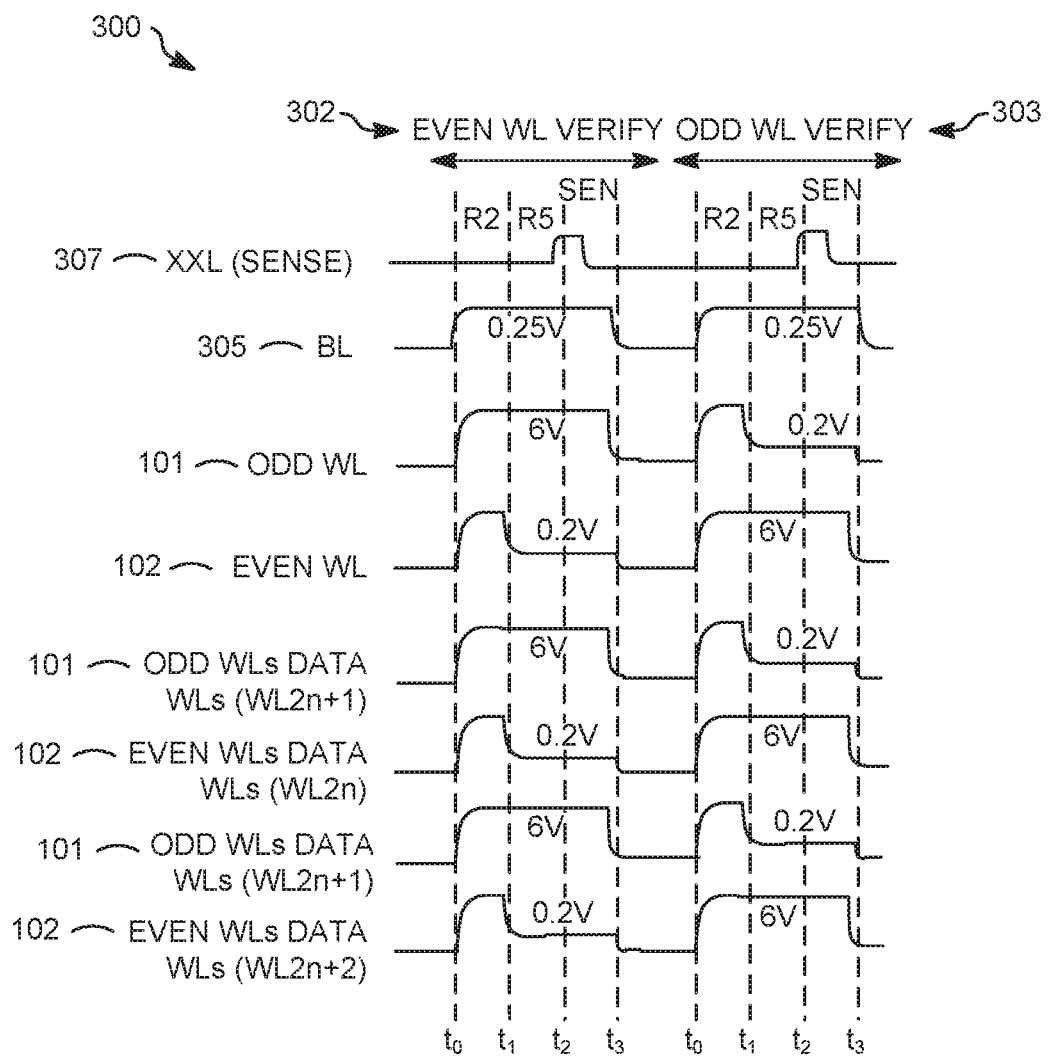
FIG. 3 shows a schematic view of wordline erase verify for a nonvolatile memory according to an aspect of the present disclosure.

FIG. 3 shows the timing diagram 300 for the erase verify operation using charging both the wordline to be verified and the wordline not being verified to the high voltage state. Once the high voltage state is reached by both the odd and even wordlines, then the wordline being verified is reduced to the lower verify voltage while the non-verify wordline remains at the high voltage state. In the timing diagram 300, the even wordline verify 302 is performed first. At time t0, the bitline 305 is charged to is high state. The odd wordlines 101 are charged to the verify high state. The even wordlines 102 are charged to the verify high state at the same time that the odd wordlines 101 are charged. The simultaneous charging of the even and odd wordlines reduces the capacitive effects on the RC delay. The capacitive effect is reduced as there is no voltage difference between the two adjacent plates, i.e., the even wordline and the odd wordline. When both the odd wordline 101 and the even wordline 102 reach the high verify voltage, then the wordline being verified is reduced to the verify voltage at $t_1$. The sense circuitry 307 is driven high or sensing at $t_2$. This continues until $t_3$. Thereafter, all levels return to ground or zero. This process repeats for the odd wordlines with the same timing at 303m but with the odd wordlines being dropped to the verify voltage and the even wordlines being held at the high state.

The charging of both the even and odd wordlines and then ramping the wordline group (odd or even) while maintaining the wordline not being verified at the high level will reduce the time it takes to have both the odd and even wordlines charged to the correct levels for the erase verify operation. The ramping down to the verify level takes less time than the old method of charging the non-verify wordline group to the high state and then charging the verify wordline group to the verify level.

Figure 4:
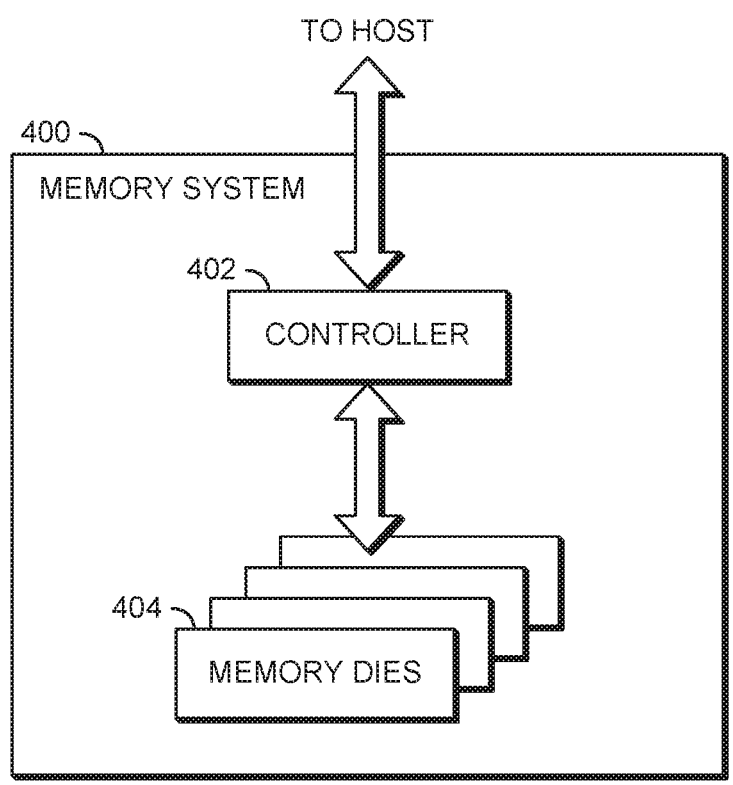
FIG. 4 generally illustrates a block diagram of an example memory system according to an aspect of the present disclosure.

FIG. 4 generally illustrates a block diagram illustrating a memory system 400. The memory system 400 may include a controller 402 and memory that may include or be made up of one or more memory dies 404. As used herein, the term die refers to the set of memory cells, and associated circuitry for managing the physical operation of those memory cells, that are formed on a single semiconductor substrate. The controller 402 may interface with a host system and transmit command sequences for read, program, and erase operations to the non-memory die(s) 404.

The controller 402 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 402 can be configured with hardware and/or firmware to perform the various functions described herein and generally illustrated in the timing diagrams. For example, the controller can control the erase verify signal levels on the odd and even wordlines in the non-volatile memory. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 402 is a device that manages data stored in the memory die(s) and communicates with a host, such as a computer or electronic device. The controller 402 can have various functionality in addition to the specific functionality described herein. For example, the controller 402 can format the memory dies 404 to ensure the memory dies 404 are operating properly, map out bad flash memory cells (e.g., by using the erase verify operations as described herein), and allocate spare cells to be substituted for future failed cells. Some part of the spare cells can be used to hold firmware to operate the controller 402 and implement other features. In operation, when a host needs to read data from or write data to the memory die(s) 404, the host will communicate with the controller 402. If the host provides a logical address to which data is to be read/written, the controller 402 can convert the logical address received from the host to a physical address in the memory die(s) 404. (Alternatively, the host can provide the physical address). The controller 402 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The controller 402 can also control the erase verify operation as described herein. The memory die 404 includes the odd wordlines 101 and even wordlines 102 described herein.

The interface between the controller 402 and the non-volatile memory die(s) 404 may be any suitable interface, such as flash interface, including those configured for Toggle Mode 200, 400, 800, 1000 or higher. For some example embodiments, the memory system 400 may be a card based system, such as a secure digital (SD) or a micro secure digital (micro-SD) card. In alternate example embodiments, the memory system 400 may be part of an embedded memory system.

In the example illustrated in FIG. 4, the memory system 400 is generally illustrated as including a single channel between the controller 402 and the non-volatile memory die(s) 404. However, the subject matter described herein is not limited to memory systems having a single memory channel. For example, in some memory systems, such as those embodying NAND architectures, 2, 4, 8 or more channels may exist between the controller 402 and the memory die(s) 404, depending on controller capabilities. In any of the embodiments described herein, more than a single channel may exist between the controller and the memory die(s) 404, even if a single channel is shown in the drawings.

Figure 5:
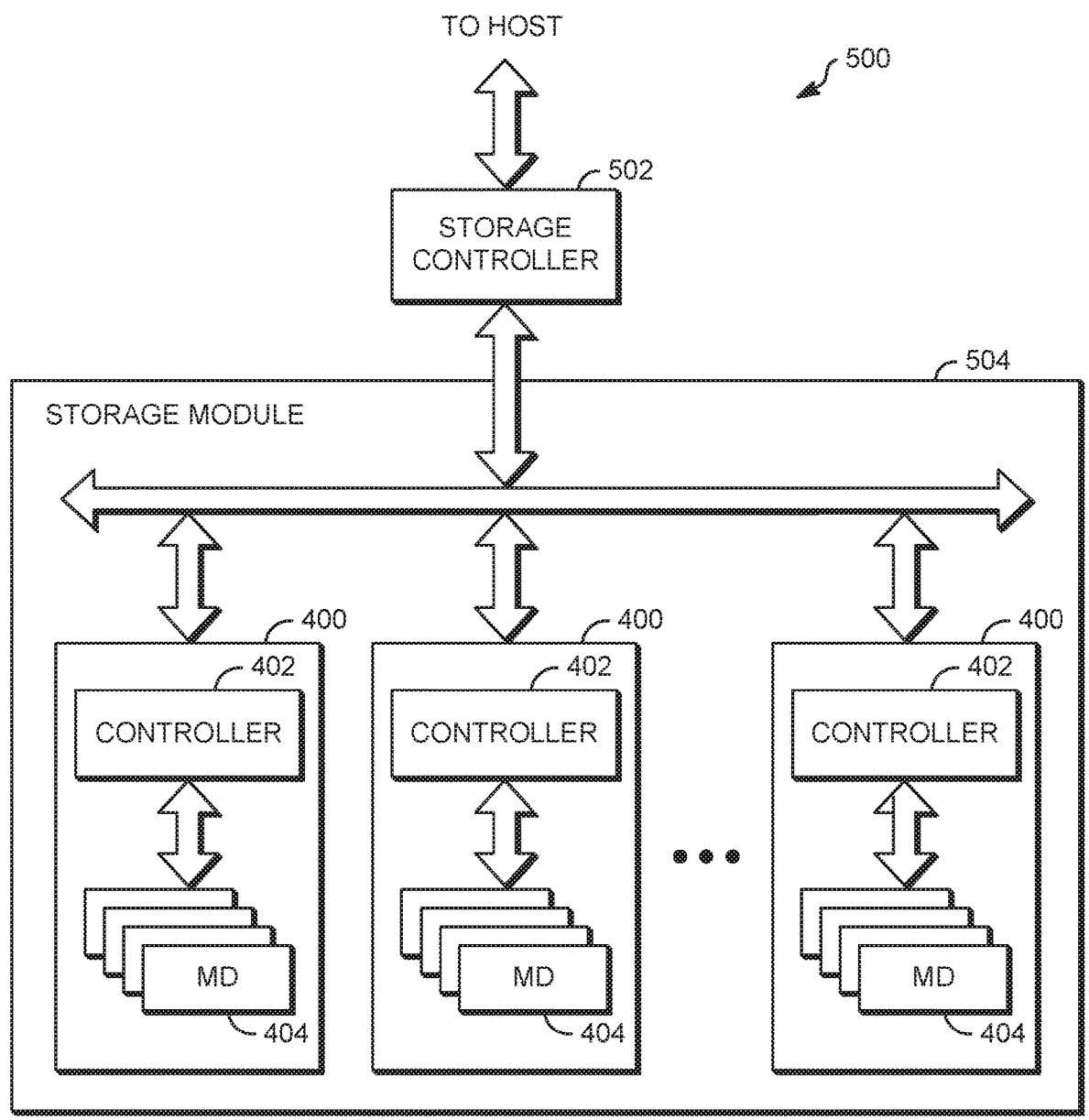
FIG. 5 generally illustrates a block diagram of an example storage module that includes a plurality of memory systems according to an aspect of the present disclosure.

FIG. 5 illustrates a storage module 500 that includes a plurality of non-volatile memory systems 400. As such, the storage module 500 may include a storage controller 502 that interfaces with a host and with a storage system 504, which includes a plurality of non-volatile memory systems 400. The interface between the storage controller 502 and non-volatile memory systems 400 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 500, in one embodiment, may be a solid state drive (SSD), such as found in portable computing devices, such as laptop computers and tablet computers, and mobile phones.

Figure 6:
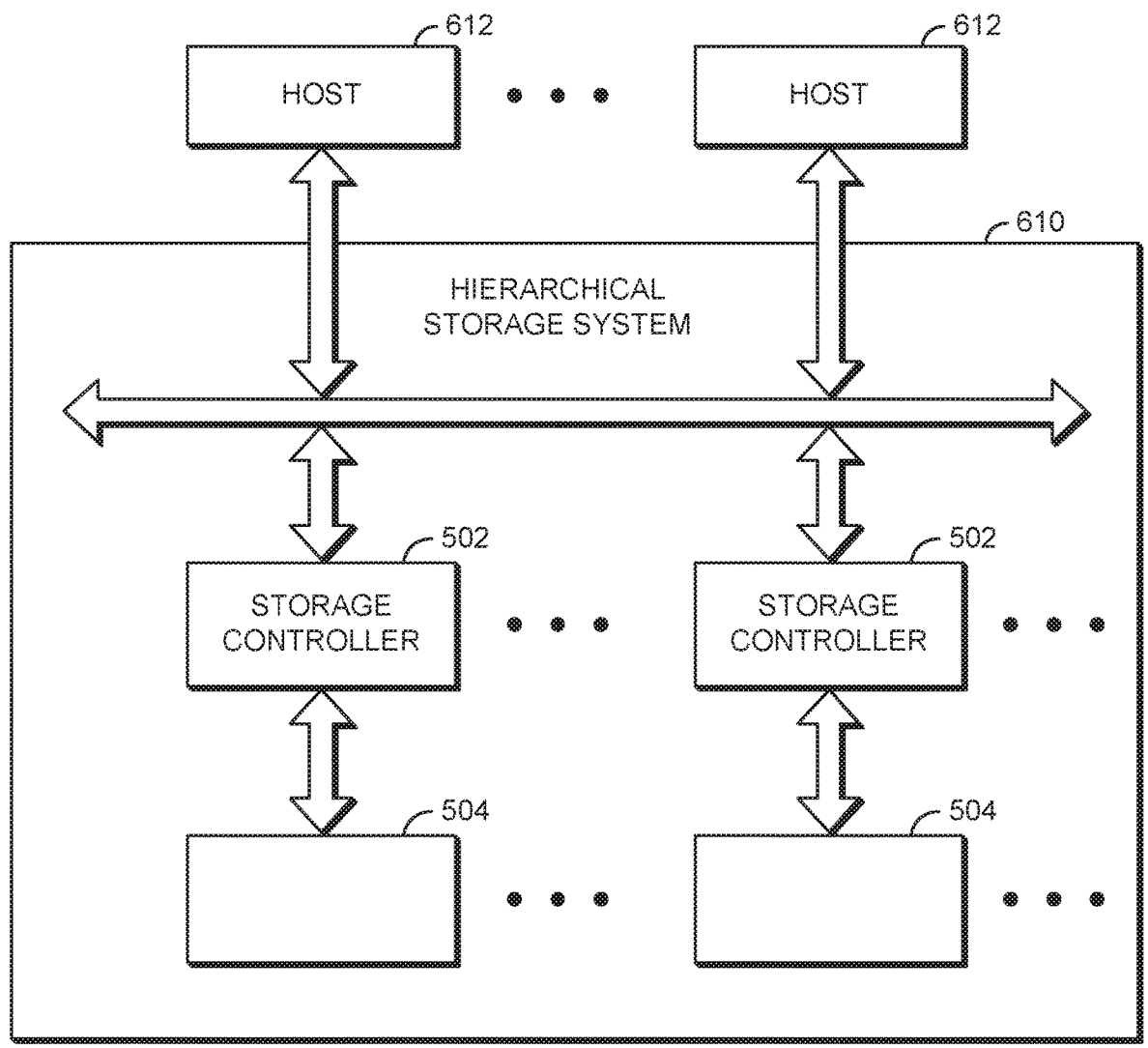
FIG. 6 generally illustrates a block diagram of an example hierarchical storage system.

FIG. 6 is a block diagram illustrating a hierarchical storage system 610. The hierarchical storage system 610 may include a plurality of storage controllers 502, each of which control a respective storage system 504. Host systems 612 may access memories within the hierarchical storage system 610 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 610 illustrated in FIG. 6 may be a rack mountable mass storage system that is accessible by multiple host computers, such as would be found in a data center or other location where mass storage is needed.

Figure 7:
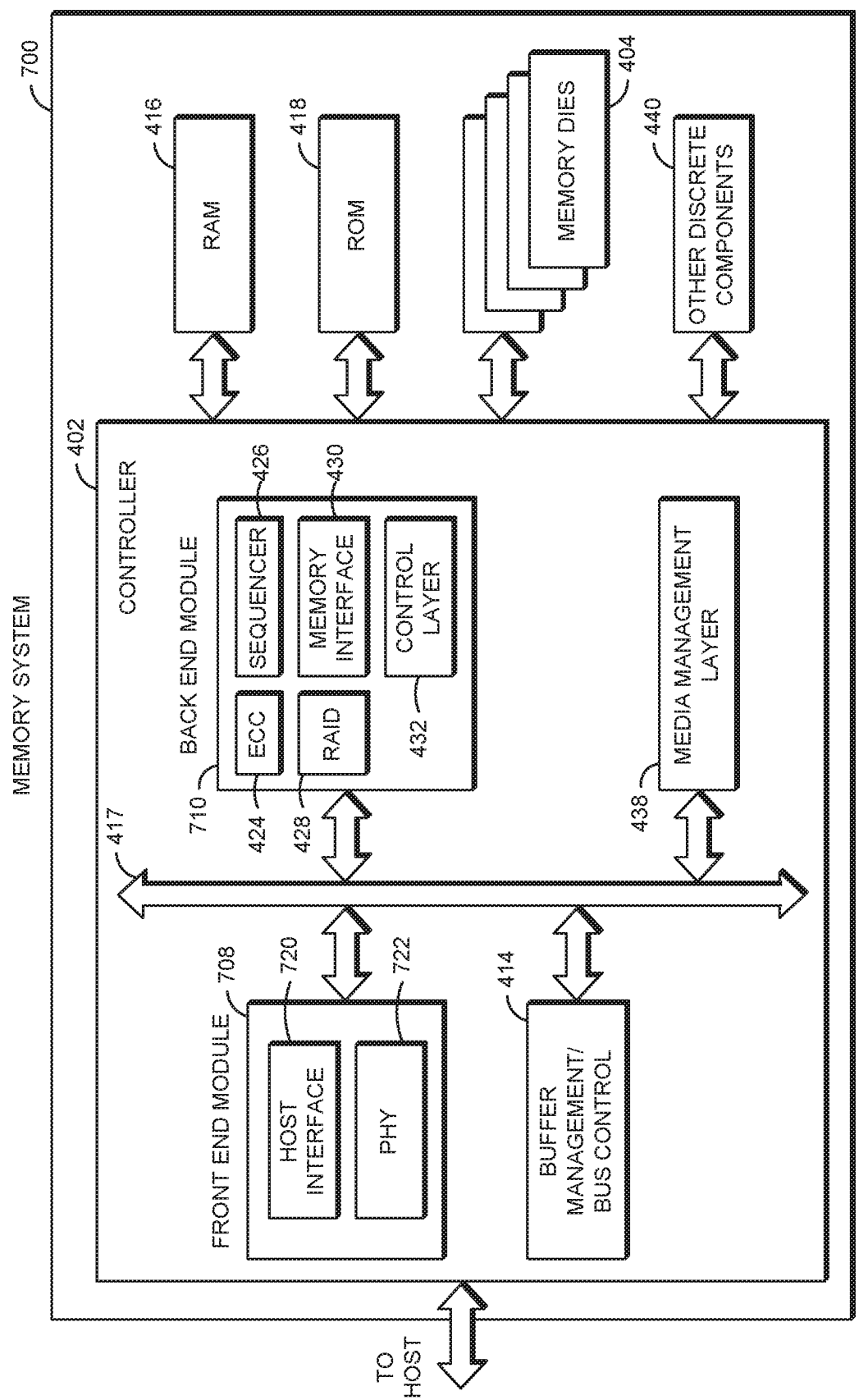
FIG. 7 generally illustrates a block diagram of an example configuration of components of a controller of the memory system of FIG. 4 according to an aspect of the present disclosure.

FIG. 7 is a block diagram illustrating exemplary components of the controller 402 in more detail. The controller 402 may include a front end module 708 that interfaces with a host, a back end module 710 that interfaces with the non-volatile memory die(s) 404, and various other modules that perform various functions of the non-volatile memory system 700. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 402 may include a buffer manager/bus controller module 414 that manages buffers in random access memory (RAM) 416 and controls the internal bus arbitration for communication on an internal communications bus 417 of the controller 402. A read only memory (ROM) 418 may store and/or access system boot code. Although illustrated in FIG. 6 as located separately from the controller 402, in other embodiments one or both of the RAM 416 and the ROM 418 may be located within the controller 402. In yet other embodiments, portions of RAM 416 and ROM 418 may be located both within the controller 402 and outside the controller 402. Further, in some implementations, the controller 402, the RAM 416, and the ROM 418 may be located on separate semiconductor dies.

Additionally, or alternatively, the front-end module 708 may include a host interface 720 and a physical layer interface (PHY) 722 that provide the electrical interface with the host or next level storage controller. The choice of the type of the host interface 720 can depend on the type of memory being used. Example types of the host interface 720 may include, but are not limited to, SATA, SATA Express, SAS, Fibre Channel, USB, PCIe, and NVMe. The host interface 720 may typically facilitate transfer for data, control signals, and timing signals.

The back end module 710 may include an error correction code (ECC) engine or module 424 that encodes the data bytes received from the host, and decodes and error corrects the data bytes read from the non-volatile memory die(s) 404. The back end module 710 may also include a command sequencer 426 that generates command sequences, such as program, read, and erase command sequences, to be transmitted to the non-volatile memory die(s) 404. Additionally, or alternatively, the back end module 710 may include a RAID (Redundant Array of Independent Drives) module 728 that manages generation of RAID parity and recovery of failed data. The RAID parity may be used as an additional level of integrity protection for the data being written into the non-volatile memory system 700. In some cases, the RAID module 428 may be a part of the ECC engine 424. A memory interface 430 provides the command sequences to the non-volatile memory die(s) 404 and receives status information from the non-volatile memory die(s) 404. Along with the command sequences and status information, data to be programmed into and read from the non-volatile memory die(s) 404 may be communicated through the memory interface 430. In one embodiment, the memory interface 430 may be a double data rate (DDR) interface and/or a Toggle Mode 200, 400, 800, or higher interface. A control layer 432 may control the overall operation of back end module 710.

Additional modules of the non-volatile memory system 700 illustrated in FIG. 7 may include a media management layer 438 that performs certain memory management functions such as wear leveling of memory cells of the memory dies 404, address management, and facilitates folding operations. Other memory management functions may be possible. The non-volatile memory system 400 may also include other discrete components 440, such as external electrical interfaces, external RAM, resistors, capacitors, or other components that may interface with the controller 402. In alternative embodiments, one or more of the RAID module 428, media management layer 438 and buffer management/bus controller 414 are optional components that may not be necessary in the controller 402.

Figure 8:
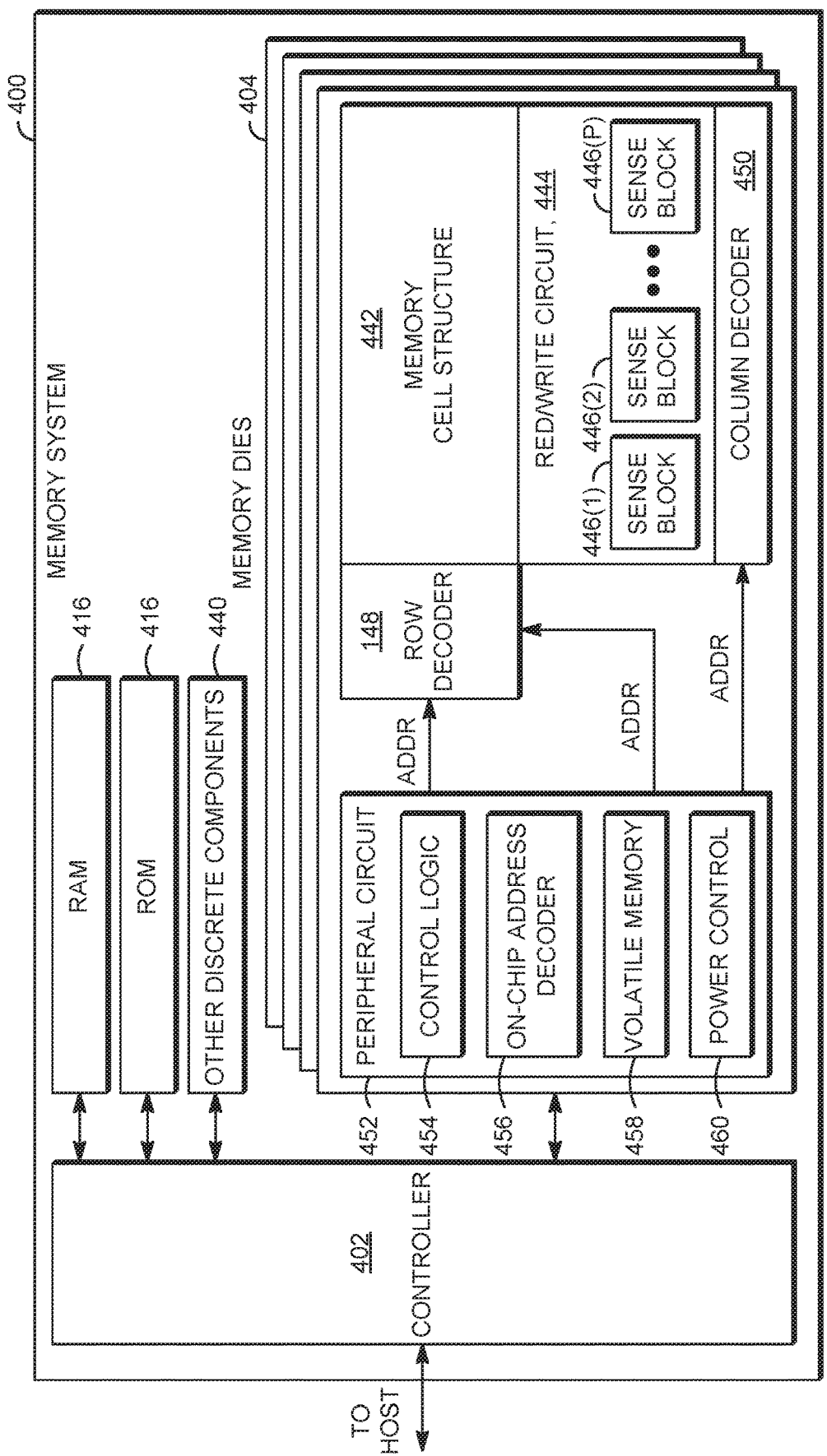
FIG. 8 generally illustrates a block diagram of an example configuration of components of a memory die of the memory system of FIG. 4 according to an aspect of the present disclosure.

FIG. 8 is a block diagram of an example configuration of components of a memory die 404 in more detail. The memory die 404 may include a memory cell structure 442 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 442. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 442 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 442, or at least a portion of the memory cell structure 442, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 9:
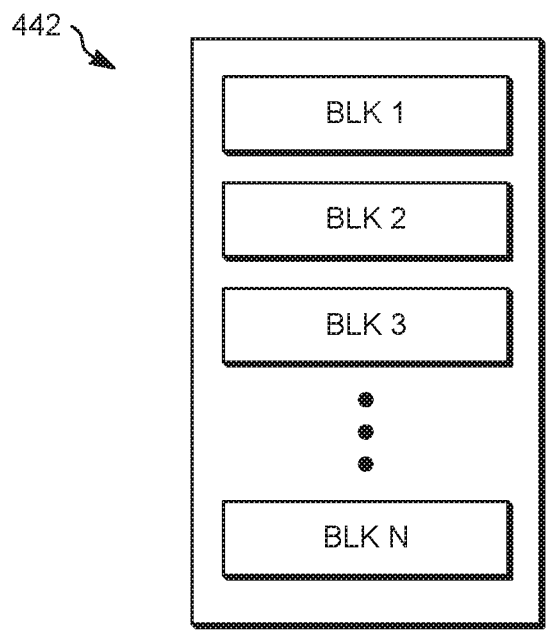
FIG. 9 generally illustrates a block diagram of a memory cell structure organized into blocks according to an aspect of the present disclosure.

Referring to FIG. 9, the memory cells of the memory cell structure 442 located on a single memory die 404 may be organized into an N-number of blocks, extending from a first block BLK 1 to an Nth block BLK N. A block is a minimum unit of erase of a memory die 404. Memory cells that are part of the same block are erased at the same time and/or as part of a same erase operation.

Figure 10:
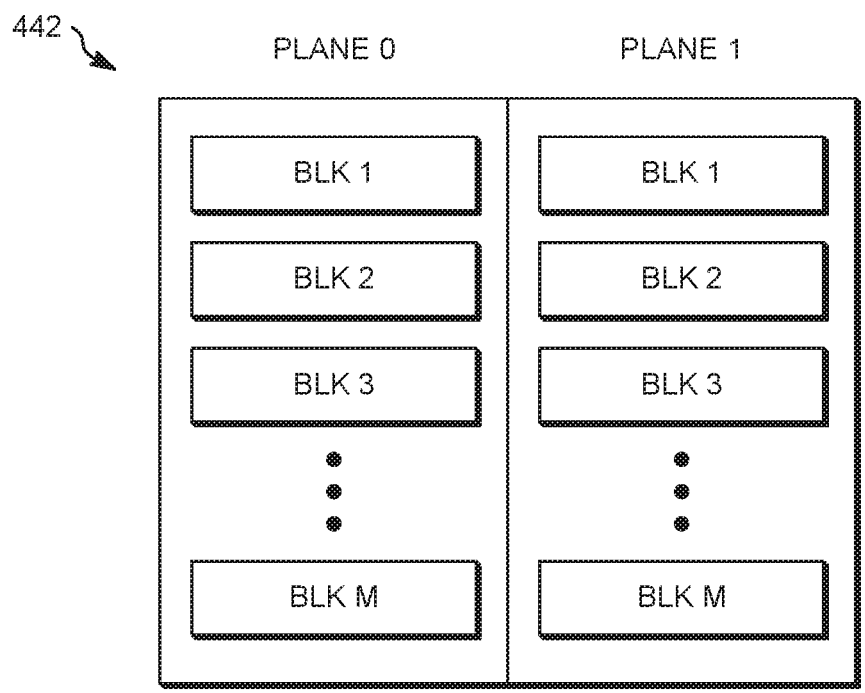
FIG. 10 generally illustrates a block diagram of a memory cell structure organized into blocks in different memory planes according to an aspect of the present disclosure.

Referring to FIG. 10, for some example configurations, the N-number of blocks located on a single memory die 404 are organized into a plurality of memory planes (or just planes). FIG. 10 generally illustrates an example configuration where the blocks are organized into two memory planes, including a first memory plane, Plane 0, and a second memory plane, Plane 1. Configurations that include more than two memory planes may be possible. In FIG. 10, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible. The memory planes include a plurality of the switches 100, 200.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally. Each vertical stack of memory cells are controlled at least in part by the switches 100, 200.

FIG. 10 generally illustrates a perspective view of at least a portion of a memory die 404 that includes a set or a plurality of three-dimensional blocks 400, which may represent at least a portion of the memory cell structure 442 of FIG. 8. For simplicity, the plurality of blocks 400 is generally illustrates as including four blocks, BLK1, BLK2, BLK3, and BLK4. In actual implementation, a given memory cell structure 442 of a memory die 404 may include several more blocks than four, such as on the order of hundreds, thousands, or tens of thousands of blocks. In a particular example configuration, one plane of blocks includes 2,000 blocks, each with a plurality of switches 100, 200.

The blocks 400 are located or disposed on a substrate of the memory die 404. The substrate may be part of a lower level or region 404 of the memory die 404 that carries or includes circuitry under the blocks 400, along with one or more lower metal layers patterned to form conductive paths that carry or supply signals or voltages output from the circuitry, such as those used to perform memory operations (read, program, sense, erase, e.g.). The lower metal layers may be connected to the switch CEG. The substrate can be the base on which the other layers and components are built upon during fabrication of the solid state memory, e.g., NAND.

The blocks 400 are disposed in an intermediate level or region 406 (also referred to as a block level or region, or an array level or region) of the memory die 404 in between the lower region 404 and an upper level or region 408 of the memory die 404. The upper region 408 may include one, more upper metal layers patterned in the form of conductive paths that carry or supply signals, or voltages output from the circuitry.

The substrate is generally a planar structure having opposing planar surfaces. Herein, the components on a memory die 404 can be physically described with reference to a three-dimensional Cartesian coordinate system having an x-axis, a y-axis, and a z-axis. The z-axis is the axis that extends perpendicular to the planar surfaces of the substrate. In general, the components on a memory die 404 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 404 along or with reference to the z-axis. For example, the blocks 400 are "above" the substrate, and the substrate is part of the lower region 404 that is "below" the blocks 400. In addition, the upper region 408 is a region of the memory die 404 "above" both the blocks 400 and the substrate. Components of the memory die 404 disposed in the upper region 408 are farther away in the z-direction from the substrate than components of the blocks 400. In general, for two components on a given memory die 404, where the first component is "above" the second component, the first component is positioned or disposed farther in the z-direction from the substrate than the second component. In addition, where the first component is "below" the second component, the first component is positioned or disposed closer in the z-direction to the substrate than the second component.

The terms "top" and "bottom" are also used to refer to the relative positioning of components of the memory die 404 in the z-direction and/or along the z-axis. In general, "bottom" components are positioned or disposed closer in the z-direction to the substrate than "top" components, and "top" components are positioned or disposed farther in the z-direction from the substrate than "bottom" components. In this context, a memory die 404 may include one or more top metal layers disposed in the upper region 408 and one or more bottom metal layers disposed in the lower region 404. In general, the bottom metal layers are positioned or disposed closer in the z-direction to the substrate than the top metal layers, and the top metal layers are positioned or disposed farther in the z-direction from the substrate than the bottom metal layers.

Although the terms "upper" and "lower," "above" and "below," and "top" and "bottom" are used to describe the relative position of components on a memory die 404, they should not be construed as limiting the relative positioning of the components since a memory die 404, or the memory system 400 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations. The bias elements can be part of circuitry to apply a given electrical signal to a component of the memory device.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible. In an example embodiment, the SGST transistors are the switches 100, 200. In an example embodiment, the SGS transistors are the switches 100, 200.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases. The wordlines WLL1-WLL48 in FIG. 11 can be biased to the high level (simultaneously) for an erase verify with the odd or even wordlines being verified ramped down to the verify voltage after all wordlines are at the high state to reduce the capacitive effect in the RC delay to each the high voltage state.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Additionally, or alternatively, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage (e.g., the high level, the erase verify level or the low level) to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate, and the other planar surface is a bottom surface that faces in the z-direction toward the substrate.

Herein, the terms "line" and "layer," at least as they are used to refer to control lines, except SGD lines as described in further detail below, are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, or alternatively, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Additionally, or alternatively, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 11:
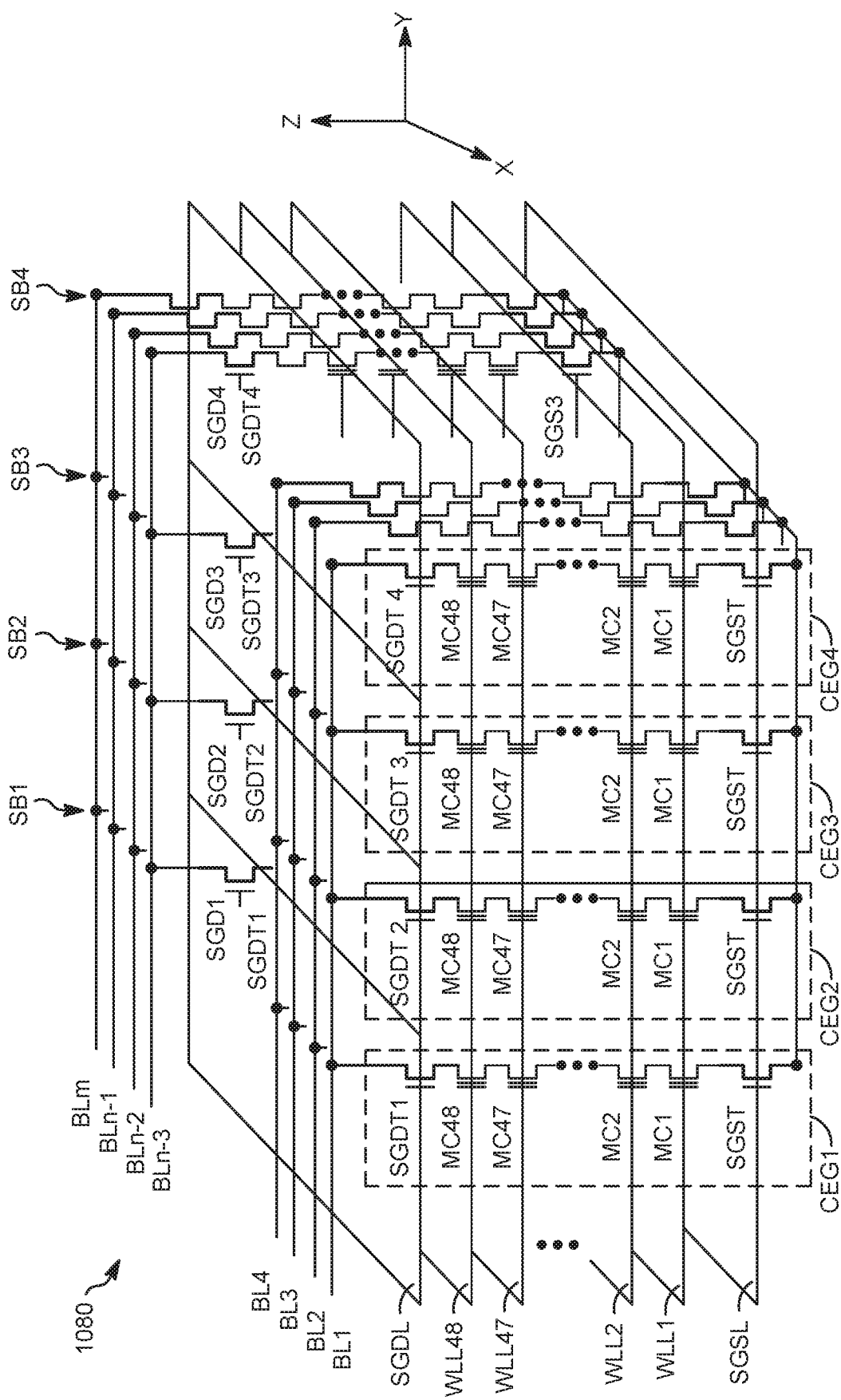
FIG. 11 generally illustrates a circuit schematic diagram of a block of memory cells three-dimensionally arranged into a plurality of NAND strings.

The numbers of bias elements and their respective bias element types used for the channel element groups and the number of corresponding control gate layers in the example configuration of the block 1080 in FIG. 11 are non-limiting and merely exemplary for purposes of illustration. Other numbers of bias elements for any of the bias element types, or other configurations that do not include bias elements of certain bias elements types or that include one or more bias elements of bias element types other than those illustrated in FIG. 11, may be possible.

FIG. 11 generally illustrates a circuit schematic diagram of an example configuration of a three-dimensional block 1080, which may be representative of at least a portion of one of the blocks of FIG. 9 and/or have the physical construction or structure as depicted in other figures. In FIG. 11, each bias element is represented or depicted as a transistor. In addition, memory cells are labeled MC, SGD transistors are labeled SGDT, and SGS transistors are labeled SGST. In the example block 1080, each channel element group includes fifty cells, including forty-eight memory cells, extending from a first memory cell MC1 to a 48th memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 11, the block 1080 includes fifty control gate layers, including forty-eight word line layers extending from a first word line layer WLL1 to a 48th word line layer WLL48, a SGD layer SGDL, and a SGS layer SGSL. As previously described, the ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the 48th memory cells MC48 of the channel element groups CEG are disposed in and configured to have their control gates biased by the 48th word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

The channel element groups CEG and their associated channels are two-dimensionally arranged in the x and y directions in the block 1080, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a block or of the memory cell structure generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 442, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 442, including blocks and word line cell groups of the memory cell structure 442, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 442 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular, embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die 404.

The power control circuit may include any of various circuit topologies or circuit configurations to generate and/or supply the voltages at appropriate levels to perform memory operations, (including read, program/write, sense, verify and erase operations), such as driver circuits, current sources, charge pumps, reference voltage generators, regulators, and pulse generation circuits, or any of various combinations thereof. Other types of circuits to generate the voltages may be possible. In addition, the power control circuit may communicate with and/or be controlled by the control logic circuit, the read/write circuits, and/or the sense blocks in order to supply the voltages at appropriate levels and at appropriate times to carry out the memory operations.

During read operations, the power control circuit may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit to use to bias the word lines during read operations. The data structure may include multiple sets of read threshold levels; each corresponding to a different area of the memory dies 404.

The memory system 400 may be configured to perform a read threshold calibration process that updates or revises one or more sets of the read threshold levels maintained in the data structure to more optimal values corresponding to changes in operating conditions. In various embodiments described herein, the read threshold calibration process that the memory system 400 performs may be based on bit error rates (BERs) determined from data read from the memory dies 404. The data read from the memory dies 404 to perform the calibration may be performed in response to host read requests. In addition or alternatively, the calibration may be a continuous process, such as a process continuously performed as host read requests are received, rather than as a discrete background process triggered by a certain metric, such as program/erase cycle count, as an example. Also, the calibration process may leverage the way in which the read/write circuit reads data based on pages (e.g., lower, middle, upper) in order to determine voltage bins across a threshold voltage range over which the threshold voltage distribution curves extend, and BERs for those bins. Based on the determined BERs, the memory system 400 may determine in which direction to shift a read voltage level (increase or decrease), and by how much.

In further detail, the read/write circuit may execute a read operation to read one or more pages of data from the memory dies 404. To do so, the read/write circuit may execute the read operation in a sequence of stages dependent on the page types. For example, to read data from a page of MLC cells configured to store two bits-per-cell, the read/write circuit may read the lower page first in a first stage, and then the upper page in a second stage. As another example, to read data from a page of MLC cells configured to store three bits-per-cell, the read/write circuit may read the lower page first in a first stage, then the middle page in a second stage, and then the upper page in a third stage.

To read a given page, sense circuits of the sense blocks, coupled to the memory cells storing the page, perform a predetermined number of sense operations, each with the word lines coupled to the memory cells biased at an associated one of the read threshold voltage levels Vr. For an SLC storage scheme, the power control circuit biases the word lines with the threshold voltage VrA associated with program state A, and the sense circuits perform a single sense operation. In response to the sense operation, the sense circuits identify those SLC cells in the erase state Er as storing a logic 1 value, and identify those SLC cells in memory state A as storing a logic 0 value. The erase verify may use the wordline charging methods are described herein.

For MLC storage schemes, to read a given page, sense circuits coupled to the memory cells storing the page perform multiple sense operations, such as two, three, or four sense operations, each with the word lines biased at a different one of the read threshold voltage levels Vr. The read threshold levels Vr that are applied depend on how many bits-per-cell the MLC cells are storing, which page is being read, and which number sense operation is being performed. In one example three bits-per-cell MLC storage scheme, to read a lower page, the sense circuits perform two sense operations, including a first sense operation with the word lines biased at the read threshold level VrA associated with memory state A, and a second sense operation with the word lines biased at the read threshold level VrE associated with memory state E. Read threshold voltage levels VrA and VrE applied during first and second sense operations.

Figure 12:
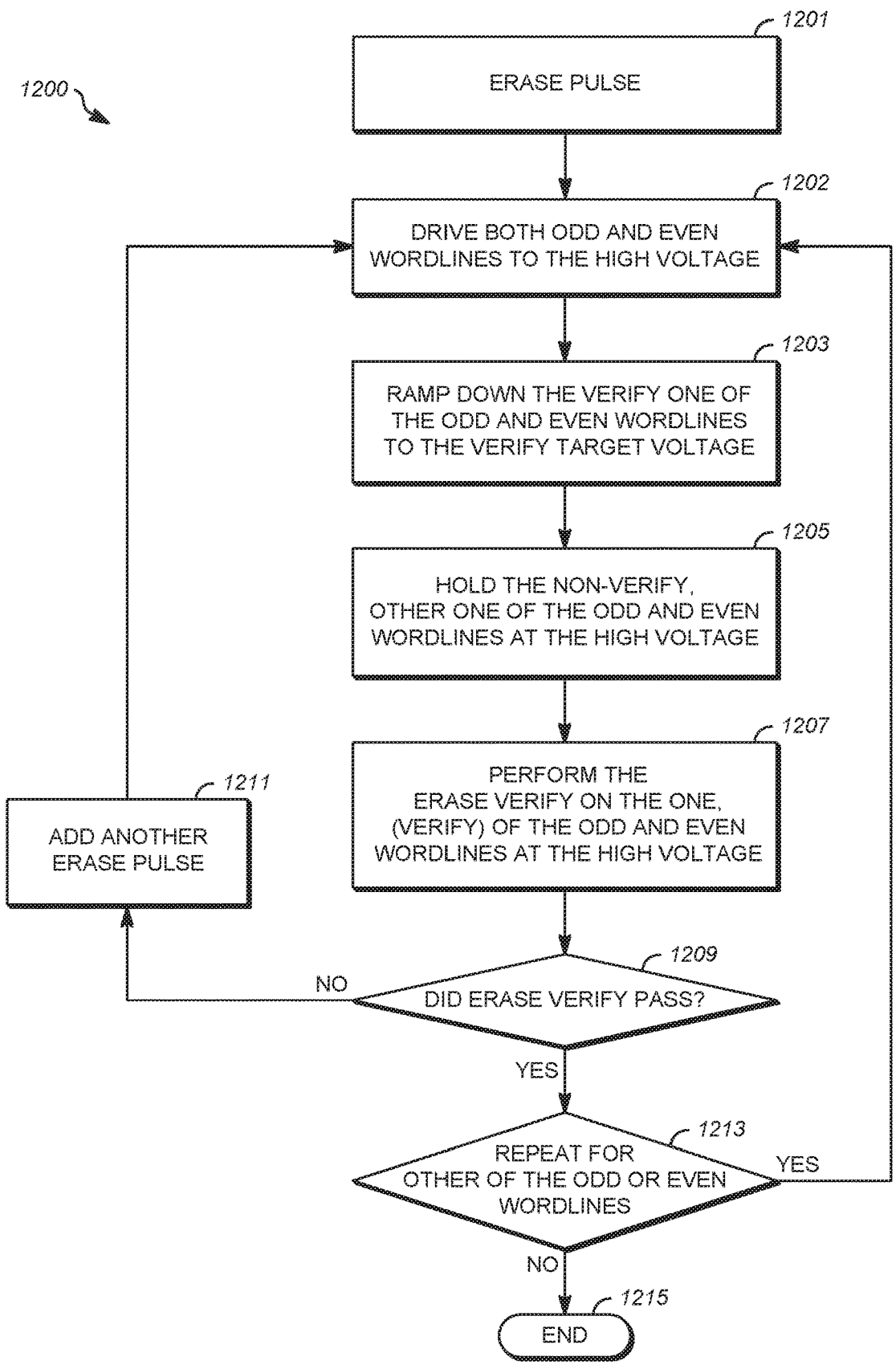
FIG. 12 illustrated a flow chart of a method according to an aspect of the present disclosure.

FIG. 12 shows a flow chart 1200 for performing an erase verify using an aspect of the present disclosure. At 1202, the erase command starts and an erase pulse is applied in the memory device. The erase pulse can be directed to a page of memory strings and cells in the strings.

At 1202, both the odd wordlines and the even wordlines are driven to a high voltage. The high voltage is the voltage for the non-verify group of wordlines. This group of non-verify wordlines switches between the even and odd wordlines depending on whether the memory cells associated with the even or odd wordlines are being verified as erased.

At 1203, the process ramps the verify one of the plurality of odd wordlines and the plurality of even wordlines to a verify target voltage that is less than the high voltage;

At 1205, the non-verify one of the plurality of odd wordlines and the plurality of even wordlines is held at the high voltage; and At 1207, an erase verify operation is performed on the verify one of the plurality of odd wordlines and the plurality of even wordlines.

At 1209, the verify process determines if the erase verify operation for the memory cells passed and if one of the odd wordlines or the even wordlines is verified. For example, it determines if the erase was successful for a memory cell. If the erase verify is not pass, then the process moves to 1211 and another erase pulse is applied. The erase pulse actually erases the memory cell and can apply high voltage, e.g., 20 volts. Then the process returns to 1202.

If the erase is verified at 1209, then at 1213 the process repeats for the other of the odd or even wordlines and returns to step 1201 for the other, non-verify one of the wordlines. If both the odd and even wordlines have been through the verify process, then the verify ends at 1215.

Figure 13:
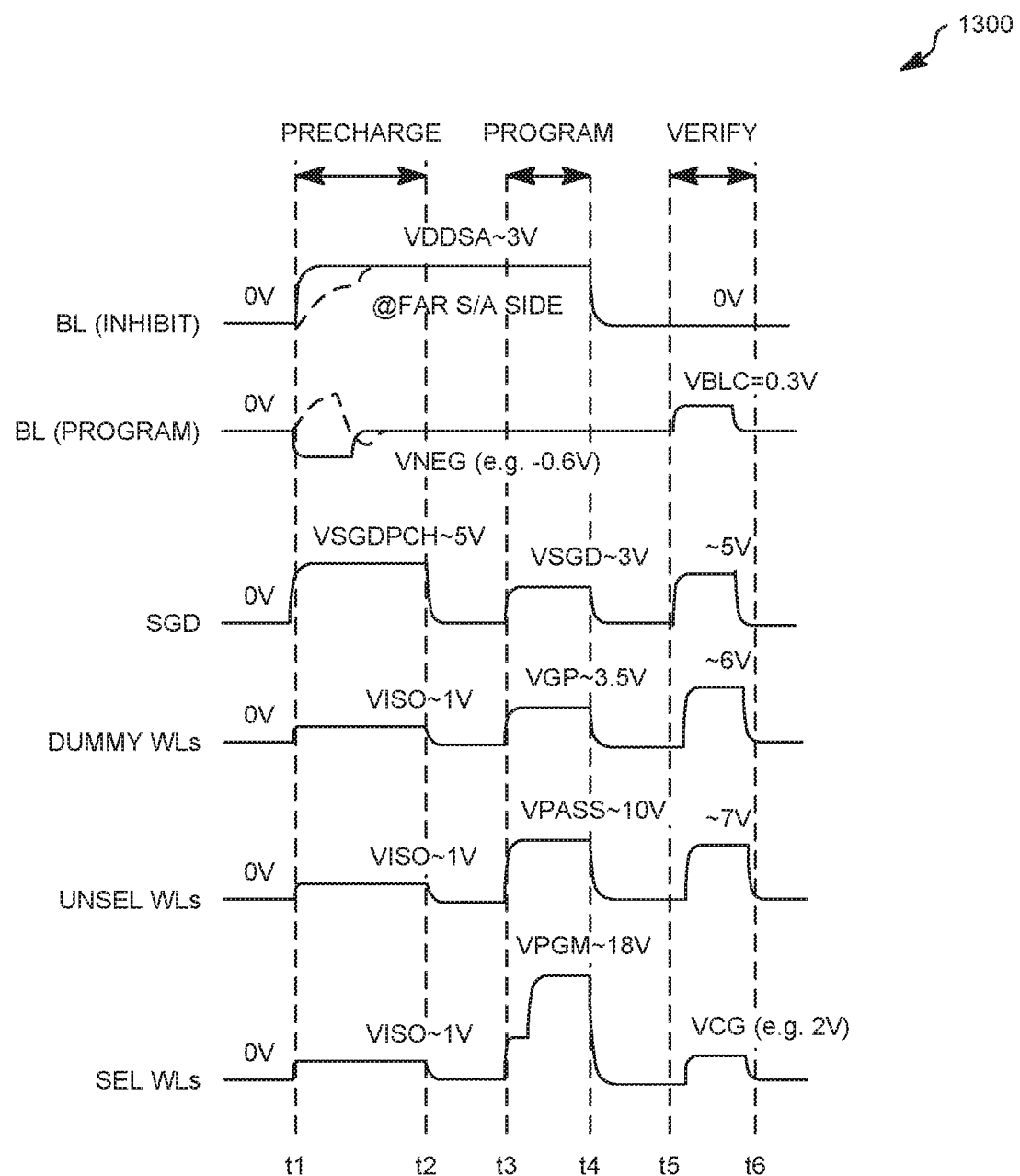
FIG. 13 illustrates a timing diagram showing a negative bitline kick on a bitline according to an aspect of the present disclosure.

FIG. 13 shows a timing diagram 1300 for an alternative method that uses a negative bitline voltage on a bitline to counter the capacitive couple of the adjacent bitlines. The bitlines can be close together and aligned horizontally, with alternating states, e.g., inhibit bitline and program bitline. The timing diagram 1300 uses a negative bitline pulse on program bitline ("0"-state) during program precharge phase. In an example, the negative bitline pulse enables both the program bitline and non-program bitline to settle down to target level much faster than conventional bitline driving/biasing at a far side of the bitlines at the sense circuitry. During programming event, inhibit bitlines are charged up to VDDSA (–3V) while program bitlines are held at 0V. However, especially for large chip, the bitline voltage at a far end sensing circuitry requires a very long settling time, relatively. In an example, during a program, the program bitlines are coupled up above 0V and requires about 20 us to settle down to 0V. The inhibit bitlines are slowed down, e.g., including RC delay, and requires about 20 us to settle down to its target voltage level (e.g., VDDSA, about 3V). This significantly slows down the program performance. The present method of timing diagram 1300 uses a "negative bitline voltage" on the bitline program, e.g., a negative bitline pulse on the program bitline with set time period. The negative bitline pulse can counter up-coupling from adjacent inhibit bitline during ramp down to negative value (e.g. –0.6V). The negative bitline pulse can accelerate both program bitline and inhibit bitline settling time during ramp up (e.g., recover) back to 0V. By using this method, much faster bitline settling time can be achieved to enable higher program performance, especially at far sensing circuitry.

Figure 14:
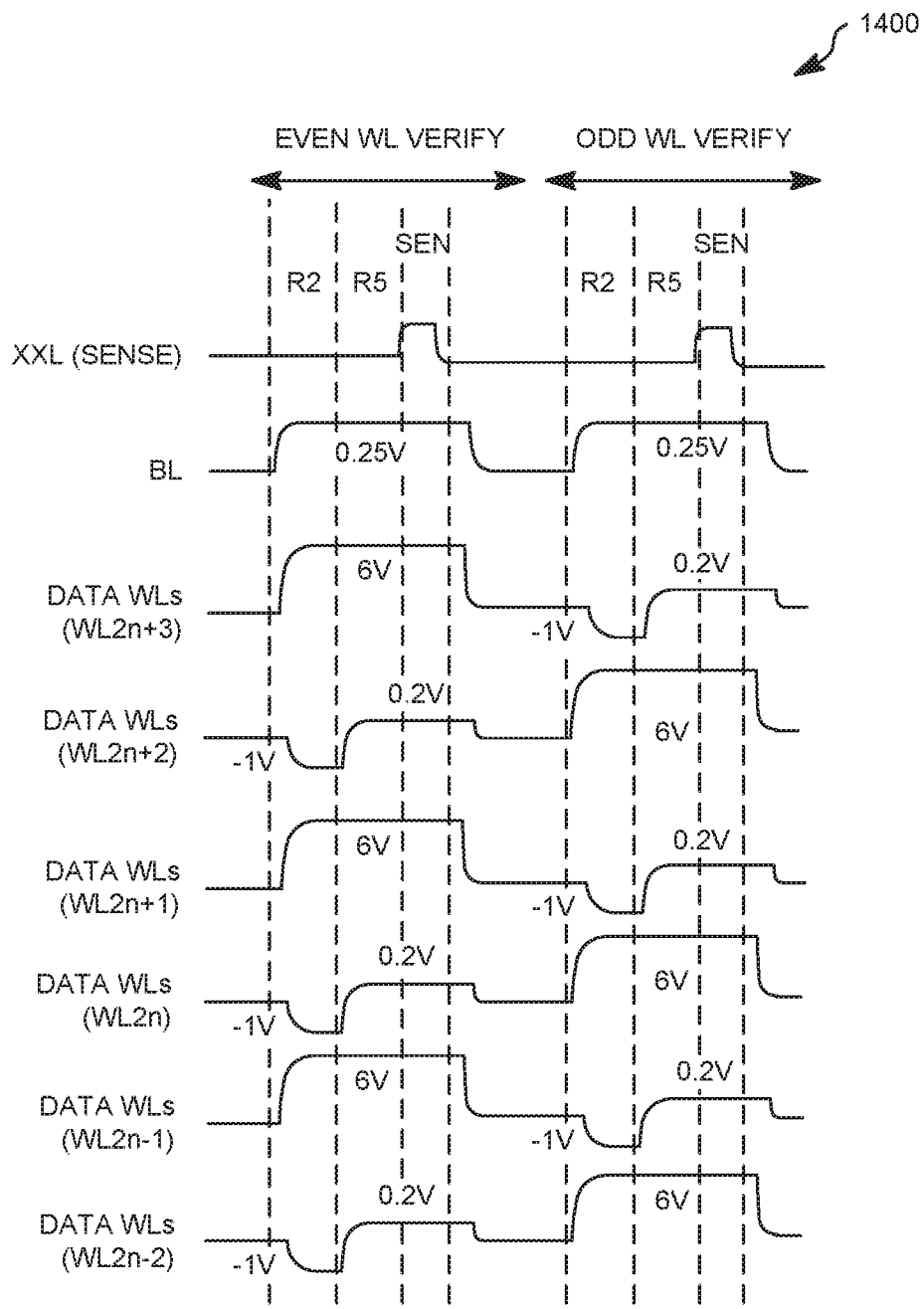
FIG. 14 illustrates a timing diagram showing a negative wordline kick on a wordline according to an aspect of the present disclosure.

FIG. 14 illustrates a timing diagram 1400 for an alternative method that uses a negative wordline voltage on a wordline to counter the capacitive couple of the adjacent wordlines. The method shows in FIG. 14 provides an alternative (even/odd) negative wordline overdrive method (below 0V) to mitigate undesired slow sensing caused by the selected wordline being capacitively coupled to a higher voltage level by the adjacent strong positive bias (VREAD) on the adjacent wordline. The method at the R2-clock, ramps the selected wordline ramps down from 0V to a negative voltage value (e.g. –1V) to counter the voltage on the adjacent wordline (e.g., VREAD) that increase RC delay due to capacitive coupling. The method at the R5-clock ramps up the wordline to a final target voltage level with a synchronized voltage signal. This reduces wordline to wordline coupling and, hence, reduces RC delay in the voltage signal reaching its desired level throughout the length of the wordline and at the far end sensing circuitry. It is believed that this method can efficiently reduce sensing time by up to 50% or about 50% during an erase verify.

The present disclosure includes methods and systems for erase verify operation in nonvolatile memory. The disclosure provides driving both a plurality of odd wordlines and a plurality of even wordlines to a read voltage, ramping a non-verify one of the plurality of odd wordlines and the plurality of even wordlines to a target voltage that is less than the read voltage, holding a verify one of the plurality of odd wordlines and the plurality of even wordlines at the read voltage, and performing an erase verify on the verify one of the plurality of odd wordlines and the plurality of even wordlines. The driving both the plurality of odd wordlines and the plurality of even wordlines to the read voltage operates to reduce capacitive delays in electrical signal propagation along both the plurality of odd wordlines and the plurality of even wordlines with adjacent wordlines being driven to a same voltage at a same time. The driving both the plurality of odd wordlines and the plurality of even wordlines to the read voltage includes driving the read voltage from a near, first end to a far, second end of the wordlines over a drive time period. The ramping includes ramping after the drive time period. In an example embodiment, the ramping reduces voltage at the second end to an order of magnitude less than the read voltage. The erase verify includes performing the sensing after the target voltage is reached at the second end of the wordline. In an example embodiment, the ramping continues until the target voltage is reached at the second end of the wordline. The erase verify includes performing the sensing after the target voltage is reached at the second end. In an example embodiment, the driving includes synchronizing the driving of the plurality of odd wordlines and the plurality of even wordlines to the read voltage. In an example embodiment, the driving includes driving to the read voltage of greater than five volts. In an example embodiment, the ramping includes ramping from the read voltage to a target voltage of less than one volt. In an example embodiment, the driving both the plurality of odd wordlines and the plurality of even wordlines to the read voltage minimizes wordline coupling between adjacent odd and even wordlines.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. An erase verify method for non-volatile memory, comprising:

driving both a plurality of odd wordlines and a plurality of even wordlines to a high voltage;

ramping a verify one of the plurality of odd wordlines and the plurality of even wordlines to a verify target voltage that is less than the high voltage;

holding a non-verify one of the plurality of odd wordlines and the plurality of even wordlines at the high voltage; and performing an erase verify on the verify one of the plurality of odd wordlines and the plurality of even wordlines.

2. The method of claim 1, wherein the driving both the plurality of odd wordlines and the plurality of even wordlines to the read voltage operates to reduce capacitive delays in electrical signal propagation along both the plurality of odd wordlines and the plurality of even wordlines with adjacent wordlines being driven to a same voltage at a same time.

3. The method of claim 1, wherein the driving both the plurality of odd wordlines and the plurality of even wordlines to the read voltage includes driving the read voltage from a near, first end to a far, second end of the wordlines over a drive time period.

4. The method of claim 3, wherein ramping a verify one of the plurality of odd wordlines and the plurality of even wordlines includes ramping after the drive time period.

5. The method of claim 4, wherein ramping includes reducing voltage at the second end to an order of magnitude less than the read voltage.

6. The method of claim 3, wherein performing an erase verify includes performing the sensing after the target voltage is reached at the second end.

7. The method of claim 3, wherein ramping continues until the target voltage is reached at the second end.

8. The method of claim 7, wherein performing an erase verify includes performing the sensing after the target voltage is reached at the second end.

9. The method of claim 1, wherein driving includes synchronizing the driving of the plurality of odd wordlines and the plurality of even wordlines to the read voltage.

10. The method of claim 1, wherein driving includes driving to the read voltage of greater than five volts.

11. The method of claim 10, wherein ramping includes ramping from the read voltage to a target voltage of less than one volt.

12. The method of claim 1, wherein the driving both the plurality of odd wordlines and the plurality of even wordlines to the read voltage minimizes wordline coupling between adjacent odd and even wordlines.

13. The method of claim 1, further comprising applying a negative bitline pulse to the program bitline during a start of a precharge of a program bitline during a programming.

* * * * *